(12) United States Patent
Subashchandrabose et al.

(10) Patent No.: US 8,069,327 B2
(45) Date of Patent: Nov. 29, 2011

(54) COMMANDS SCHEDULED FOR FREQUENCY MISMATCH BUBBLES

(75) Inventors: Ramesh Subashchandrabose, Bangalore (IN); Anupam Mohanty, Bangalore (IN); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 801 days.

(21) Appl. No.: 11/648,341

(22) Filed: Dec. 28, 2006

(65) Prior Publication Data

US 2008/0159335 A1 Jul. 3, 2008

(51) Int. Cl.
G06F 12/02 (2006.01)

(52) U.S. Cl. ................... 711/167; 711/E12.002

(58) Field of Classification Search .................. None
See application file for complete search history.

(56) References Cited

U.S. PATENT DOCUMENTS

| | | | |
|---|---|---|---|
| 5,649,050 A * | 7/1997 | Hardwick et al. ............ 704/203 |
| 6,373,289 B1 | 4/2002 | Martin et al. |
| 6,493,250 B2 | 12/2002 | Halbert et al. |
| 6,658,509 B1 | 12/2003 | Bonella et al. |
| 6,697,888 B1 | 2/2004 | Halbert et al. |
| 6,724,679 B2 * | 4/2004 | Nagasawa et al. ....... 365/230.03 |
| 7,024,518 B2 | 4/2006 | Halbert et al. |
| 2003/0028816 A1 * | 2/2003 | Bacon .......................... 713/500 |
| 2003/0081490 A1 * | 5/2003 | Nagasawa et al. ....... 365/230.03 |
| 2004/0098540 A1 * | 5/2004 | Itoh et al. ...................... 711/118 |

* cited by examiner

*Primary Examiner* — Pierre-Michel Bataille
*Assistant Examiner* — Ryan Dare
(74) *Attorney, Agent, or Firm* — Blakely, Sokoloff, Taylor & Zafman LLP

(57) ABSTRACT

In some embodiments, a chip includes chip interface transmitters, a chip, and clock gearing logic. The transmitters are to transmit signals in frames including slots. The scheduler is to schedule signals at a first frequency including commands for first slots of the frames in general and commands for second slots of at least some frames immediately preceding frequency mismatch bubbles occurring when the frames are at a second frequency. The clock gearing logic is to provide the signals having the first frequency from the scheduler to the transmitters at the second frequency. Other embodiments are described.

22 Claims, 7 Drawing Sheets

| | A Slot | RAS 1 | CAS 1 | RAS 2 | CAS 2 | RAS 3 | CAS 3 |
|---|---|---|---|---|---|---|---|
| Clk 1 (Scheduler clock) | B Slot | NOP or WD | NOP or WD | NOP or WD | NOP or WD | NOP or WD | NOP or WD |
| | C Slot | NOP or WD | NOP or WD | NOP or WD | NOP or WD | NOP or WD | NOP or WD |

As provided by schedular 16

Frame 1 Cycle 1 | Frame 2 Cycle 2 | Frame 3 Cycle 3 | Frame 4 Cycle 4 | Frame 5 Cycle 5 | Frame 6 Cycle 6

FIG. 2 (Prior Art)

| | A Slot | RAS 1 | CAS 1 | RAS 2 | | CAS 2 | RAS 3 | CAS 3 | |
|---|---|---|---|---|---|---|---|---|---|
| Clk 2 (FBD frame clock) | B Slot | NOP or WD | NOP or WD | NOP or WD | BBL | NOP or WD | NOP or WD | NOP or WD | BBL |
| | C Slot | NOP or WD | NOP or WD | NOP or WD | | NOP or WD | NOP or WD | NOP or WD | |

As received by buffer 34

Frame 1 Cycle 1 | Frame 2 Cycle 2 | Frame 3 Cycle 3 | Frame 4 Cycle 4 | Frame 5 Cycle 5 | Frame 6 Cycle 6 | Frame 6 Cycle 7 | Cycle 8

As provided by schedular 116

| Clk 1 (Scheduler clock) | | | | | | |
|---|---|---|---|---|---|---|
| A Slot | RAS 1 | CAS 1 | RAS 2 | RAS 3 | CAS 3 | RAS 4 |
| B Slot | NOP or WD | NOP or WD | CAS 2 | NOP or WD | NOP or WD | CAS 4 |
| C Slot | NOP or WD | NOP or WD | NOP | NOP or WD | NOP or WD | NOP |
| | Frame 1 Cycle 1 | Frame 2 Cycle 2 | Frame 3 Cycle 3 | Frame 4 Cycle 4 | Frame 5 Cycle 5 | Frame 6 Cycle 6 |

FIG. 6

As received by buffer 134

| Clk 2 (FBD frame clock) | | | | | | | |
|---|---|---|---|---|---|---|---|
| A Slot | RAS 1 | CAS 1 | RAS 2 | | RAS 3 | CAS 3 | RAS 4 |
| B Slot | NOP or WD | NOP or WD | CAS 2 | BBL | NOP or WD | NOP or WD | CAS 4 |
| C Slot | NOP or WD | NOP or WD | NOP | | NOP or WD | NOP or WD | NOP |
| | Frame 1 Cycle 1 | Frame 2 Cycle 2 | Frame 3 Cycle 3 | Cycle 4 | Frame 4 Cycle 5 | Frame 5 Cycle 6 | Frame 6 Cycle 7 |

(with BBL extending to Cycle 8)

US 8,069,327 B2

COMMANDS SCHEDULED FOR FREQUENCY MISMATCH BUBBLES

BACKGROUND

1. Technical Field

The present inventions relate to systems, such as memory systems, in which commands are scheduled to be delivered during frequency mismatch bubbles.

2. Background Art

Various arrangements for memory chips in a memory system have been proposed. One such system is referred to as a Fully-Buffered Dual In-Line Memory Module (FBD or FBDIMM) system. FIG. 1 provides an example of an FBD system that includes a memory controller (host) 12, clock circuitry 14, a memory module 24, and a memory module 26. Memory module 24 includes a substrate 32 that supports a buffer 34 and eight synchronous dynamic random access memory devices (DRAMs) 38-1 . . . 38-8. (The number of DRAMs does not have to be eight.) Command, address, and write data (CAW) signals are provided from memory controller 12 to buffer 34 on conductors 42, and read data signals are provided from buffer 34 to memory controller 12 on conductors 44. The CAW are provided by buffer 34 to memory chips 38-1 . . . 38-8 and buffer 54, and read data is provided by memory chips 38-1 . . . 38-8 to buffer 34.

CAW signals are also provided from buffer 34 to buffer 54 through conductors 46 and read data signals are provided from buffer 54 to buffer 34 through conductors 48. The CAW are provided by buffer 54 to memory chips 58-1 . . . 58-8, supported by substrate 52, and read data is provided from memory chips 58-1 . . . 58-8 to buffer 54.

Memory controller 12 includes a scheduler 16 to schedule signals (including commands, address, and write data) to be provided through chip interface transmitters (FBD physical layer) 20. Clock (Clk) 1 is provided to scheduler 16 and clock gearing logic 18. Clock (Clk) 2 is provided to clock gearing logic 18, transmitting circuitry 20, and modules 24 and 26. Clock 2 is received by buffers 34 and 54 and passed on to the DRAM chips. Clock 2 has a higher frequency than clock 1. As an example, clock 2 may have a frequency of 533 MHz (1066 MHz double data rate (DDR)) and clock 1 may have a frequency of 400 MHz. This is a ratio of 4:3. Because of the difference in frequency, a frequency mismatch bubble between scheduled frames will occur in buffers 34 and 54 as shown in FIG. 3. Clock gearing logic 18 transitions signals from the frequency of clock 1 to the frequency of clock 2, and can determine the location of the bubbles and notify scheduler 16 of the temporal location of the bubbles through a beat rate signal. The temporal location of the bubbles may be expressed in various ways including identifying between which frames of scheduled commands the bubbles (BBL) will occur.

Transmitter circuitry 20 increases the frequency of the frames to 6 times that of clock 2 so that the CAW signals on conductors 42 have a frequency that is six times that of clock 2. However, buffer 34 reduces the frequency by a factor of six so that the signals from buffer 34 have the frequency of clock 2. Although the frequency is increased through transmitter circuitry 20, the number of conductors is reduced, and as the frequency is reduced through buffer 34, the number of conductors is increased.

The CAW signals are provided in frames that include three slots (the A slot, the B slot, and the C slot), each of which can hold a command, including operation commands and no operation (NOP) signals. The B and C slots can hold write data that is provided before or after the associated write command.

FIG. 2 shows frames 1, 2, . . . 6 as provided by scheduler 16 during cycles of clock 1 (the scheduler clock), referred to as cycles 1, 2 . . . 6. Each frame includes A, B, and C slots. In FIG. 2, the A slot is shown as holding alternating RAS and CAS signals (RAS 1, CAS 1, RAS 2, CAS 2, RAS 3, CAS 3), although this is not always the case. Addresses are included in at least some of the RAS and CAS signals. The B and C slots are shown as including no operation (NOP) or write data (WD) signals in frames 2-6, but this is not required. In some implementations, it takes four frames of B and C slots to provide the write data for a write command. The designation frame 1 does not mean that it is the first frame from schedule 16. There may be other frames before frame 1.

In some FBD implementations, conductors 42 and 46 each have 10 lanes, and conductors 44 and 48 each have 14 lanes, with each lane having two conductors for differential signaling. With single ended signaling, each lane would have one conductor. While the frames are in conductors 42, the frames each are 10 lanes wide and 12 clock units in duration (six times a double data rate of clock 2 (DRAM clock)).

FIG. 3 illustrates the frames received by buffer 34 in which in the frequency of the signals is reduced by a factor of six as compared to the frames on conductors 42. The FBD frame clock is at the reduced frequency. A duration of a frame corresponds to one cycle of clock 2 (the DRAM clock). As illustrated, frames 1, 2, and 3 occur during cycles of clock 2 referred to as cycles 1, 2, and 3. The A slots of frames 1, 2, and 3 during cycles 1-3 include commands RAS 1, CAS 1, and RAS 2, and the B and C slots include NOP or write data. Because of the frequency of clock 2 is 4/3 times greater than that of clock 1, during cycle 4 of clock 2, signals scheduled by scheduler 16 for frame 4 are not provided until cycle 5 of clock 2. Cycle 4 is referred to as a bubble (BBL). Note that there is not a similar bubble in FIG. 2. The A slots of frames 4, 5, and 6 in cycles 5, 6, and 7 include CAS 2, RAS 3, and CAS 3 commands, and slots B and C include NOP or write data signals. Cycle 8 is also a bubble.

According to the FBD specification, the contents in B and C slots get delivered in the next DRAM cycle after delivering the command in the A slot. Accordingly, the contents in B and C slots and next frame's A slot gets delivered in same cycle to the DRAM. For example, during one clock cycle, buffer 34 provides the contents of the A slot (CAS 1) of frame 2 and the contents of the B and C slots of frame 1 to DRAMs 38-1 . . . 38-8 and buffer 54. During the next cycle, buffer 34 provides the contents of the A slot (RAS 2) of frame 3 and the contents of the B and C slots of frame 2 to DRAMs 38-1 . . . 38-8 and buffer 54.

The DRAMs may be double data rate 2 (DDR 2) DRAMs on some other type of DRAMs. The signaling between memory buffer 34 and DRAMs 38-1 . . . 38-8 may be like traditional DDR 2 signaling. There may be more or less than eight DRAM chips in the modules. DRAMs may be on only one side or both sides of the substrate. Multiple modules may be in series and/or parallel. A system may include one or more than one memory channel.

Memory controllers have been used in chipset hubs and in a chip that includes processor cores. Some computer systems include wireless transmitter and receiver circuits.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

FIG. 2 is a graphical representation of frames as provided by the scheduler of the prior art memory controller of FIG. 1.

FIG. 3 is a graphical representation of frames as received by a prior art buffer of FIG. 1.

FIG. 5 is a graphical representation of frames as provided by the scheduler of the memory controller of FIG. 4 according to some embodiments of the inventions.

FIG. 6 is a graphical representation of frames as received by a buffer of FIG. 4 according to some embodiments of the inventions.

DETAILED DESCRIPTION

The present inventions relate to systems in which commands are scheduled to be delivered during frequency mismatch bubbles. One such system is a fully-buffered DIMM system in which the contents in B and C slots of a frame get delivered by a buffer in the next cycle after delivering the contents of the A slot of the frame. By placing a command in, for example, the B slot before a bubble, the command in the B slot gets delivered by the buffer during the bubble. The placement of commands in the B slot before at least some bubbles may increase the efficiency of providing commands from the memory controller to DRAM chips.

Figure 4:
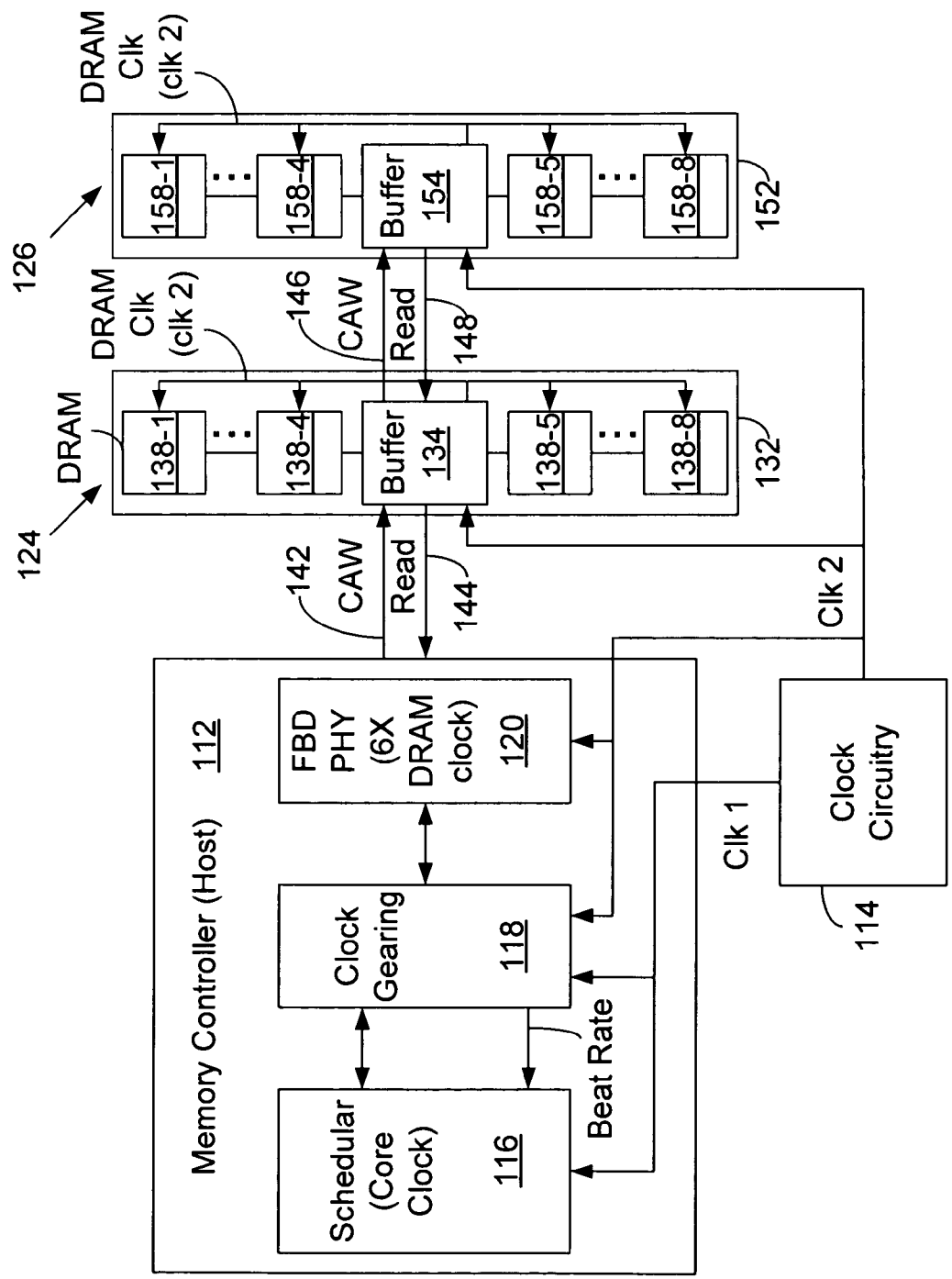
FIG. 4 is a block diagram representation of a system including a memory controller and memory modules including buffer chips according to some embodiments of the inventions.

Referring to FIG. 4, a system includes a memory controller (host) 112, clock circuitry 114, a memory module 124, and a memory module 126. Memory module 124 includes a substrate 132 that supports a buffer 134 and eight DRAMs 138-1 . . . 138-8. (The number of DRAMs does not have to be eight.) CAW signals are provided from memory controller 112 to buffer 134 on conductors 142, and read data signals are provides from buffer 134 to memory controller 112 on conductors 144. At least some of the CAW signals are provided by buffer 134 to memory chips 138-1 . . . 138-8 and buffer 154, and read data is provided by memory chips 138-1 . . . 138-8 to buffer 134.

At least some of the CAW signals are also provided from buffer 134 to buffer 154 through conductors 146 and read data signals are provided from buffer 154 to buffer 134 through conductors 148. The CAW are provided by buffer 154 to memory chips 158-1 . . . 158-8, supported by substrate 152, and read data is provided by memory chips 158-1 . . . 158-8 to buffer 154.

Memory controller 112 includes a scheduler 116 to schedule signals (including commands, address, and write data) to be provided through chip interface transmitters (FBD physical layer) 120. Clock (Clk) 1 is provided to scheduler 116 and clock gearing logic 118. Clock (Clk) 2 is provided clock gearing logic 118, transmitting circuitry 120, and modules 124 and 126. Clock 2 is received by buffers 134 and 154 and passed on to the DRAM chips. Clock 2 has a higher frequency than clock 1. As an example, clock 2 may have a frequency of 533 MHz (1066 DDR) and clock 1 may have a frequency of 400 MHz. This is a ratio of 4:3. (Other ratios may be used.) Because of the difference in frequency, a bubble between scheduled frames will occur in buffers 134 and 154 as shown in FIG. 6. Clock gearing logic 118 transitions signals from the frequency of clock 1 to the frequency of clock 2, and can determine the location of the bubbles and notify scheduler 116 of the temporal location of the bubbles through a beat rate signal. The beat rate signal from clock gearing logic 118 to scheduler 116 indicates to scheduler 116 that there will be bubbles between frames 3 and 4 and after frame 6. The temporal location of the bubbles may be expressed in various ways including identifying between which frames of scheduled commands the bubbles (BBL) will occur.

Transmitter circuitry 120 increases the frequency of the frames to 6 times that of clock 2 so that the CAW signals on conductors 142 have a frequency which is six times that of clock 2. However, buffer 134 reduces the frequency by a factor of six so that the signals from buffer 134 have frequency of clock 2. Although the frequency is increased through transmitter circuitry 120, the number of conductors is reduced, and as the frequency is reduced through buffer 134, the number of conductors is increased.

The CAW signals are provided in frames that include three slots (the A slot, the B slot, and the C slot), each of which can hold a command, including operation commands and no operation (NOP) signals. The B and C slots can hold write data that is provided before or after the associated write command.

Figure 1:
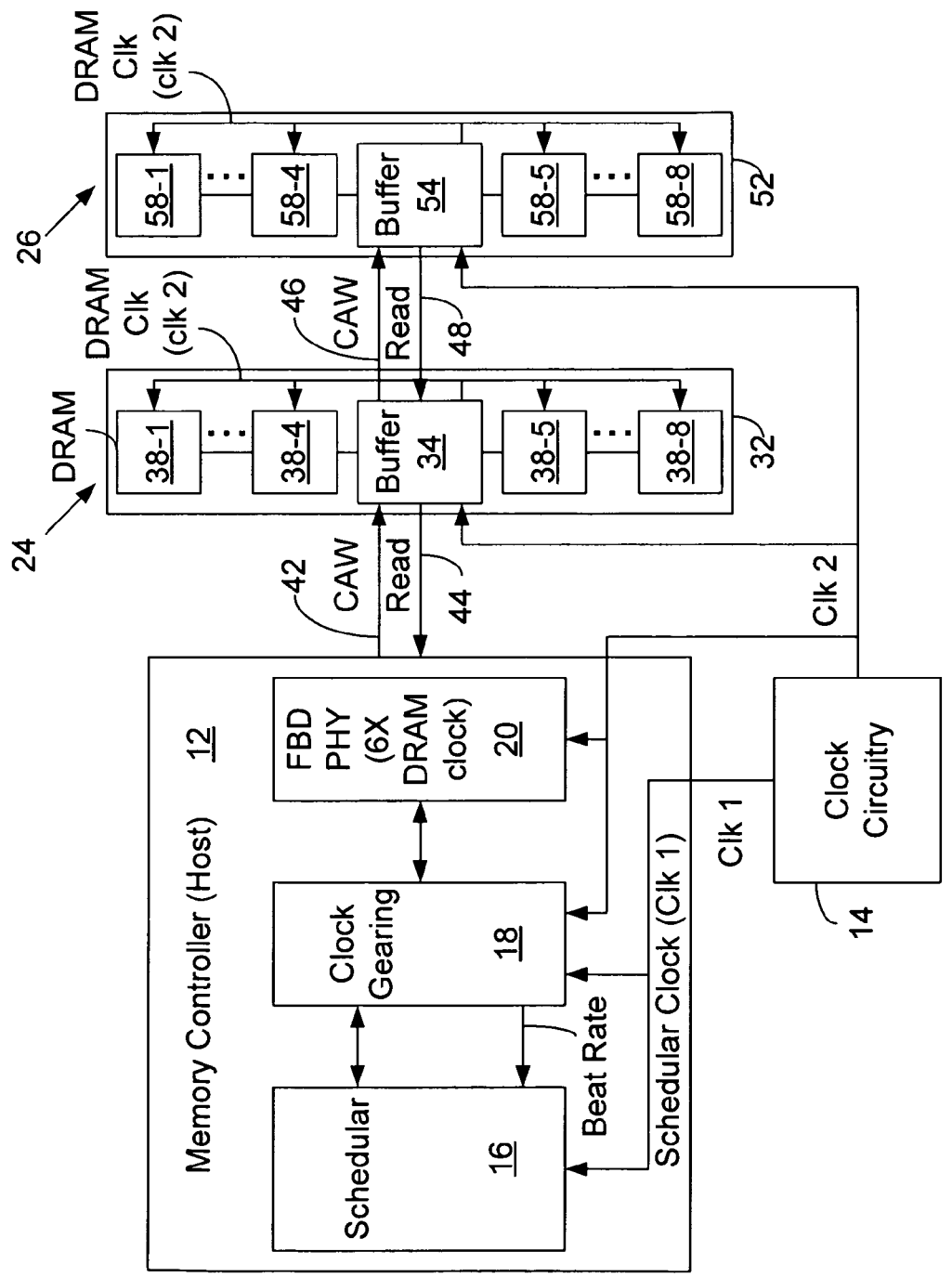
FIG. 1 is a block diagram representation of a prior art system including a memory controller and memory modules including buffer chips.

In comparing FIGS. 1 and 4, scheduler 116 operates differently than scheduler 16 by placing commands in at least some of the B slots before the positions that bubbles would appear in buffer 134. The other components may be the same as or different than in FIG. 1. For example, clock circuitry 114, clock gearing logic 118, transmitters 120, conductors 142, 144, 146, and 148, and memory modules 134 and 136 (and the components in them) in FIG. 4 may be identical to or different than clock circuitry 14, clock gearing logic 18, transmitters 20, conductors 42, 44, 46, and 48, and memory modules 34 and 36 (and the components in them) in FIG. 1. In some embodiments, buffer 134 may be identical to or different than buffers 34 and 54, and identical to or different than buffer 154 in FIG. 4.

In the following discussion, it is assumed that the contents of all the signals are passed on by buffer 134 to DRAMs 138-1-138-8 and buffer 154. However, in some embodiments, certain signals may not be passed on. For example, in some embodiments, buffer 134 does not determine whether contents is addressed to DRAMs 138-1-138-8 or DRAMs 158-1-158-8 or merely buffer 54, so it passes the contents to each DRAMs 138-1-138-8 and buffer 54. In other embodiments, it has the ability to determine and it passes to only the involved components. Also, there may be some commands or data that are directed to buffers and not DRAMs. In some embodiments, these are not passed to the DRAMs. In some embodiments, NOP signals are passed on by buffer 134 and in other embodiments, they are not.

FIG. 5 shows frames 1, 2, . . . 6 as provided by scheduler 116 during cycles of clock 1 (the scheduler clock), referred to as cycles 1 , 2 . . . 6. Each frame includes A, B, and C slots. In FIG. 5, the A slot of frames 1-6 is shown holding RAS 1, CAS 1, RAS 2, RAS 3, CAS 3, and RAS 4 signals. Addresses are included in at least some of the RAS and CAS signals. The B slot is shown holding CAS 2 and CAS 4 signals in frames 3 and 6, and the B and C slots are otherwise shown holding no operation (NOP) or write data (WD) signals in frames 2-6. However, these contents of the frames is merely an example and this ordering is not always used. The A slots may include NOP signals. In some implementations, it takes four frames of B and C slots to provide the write data for a write command. The designation frame 1 does not mean that it is the first frame from schedule 116. There may be other frames before frame 1.

In some FBD implementations, conductors 142 and 146 each have 10 lanes, and conductors 144 and 148 each have 14 lanes, with each lane having two conductors for differential signaling. With single ended signaling, each lane would have one conductor. Other numbers of lanes may be used. While the frames are in conductors 142, the frames each are 10 lanes wide and 12 clock units in duration (six times a double data rate of clock 2 (DRAM clock)).

FIG. 6 illustrates the frames received by buffer 134 where in the frequency of the signals is reduced by a factor of six as compared to the frames on conductors 142. A duration of a frame corresponds to one cycle of clock 2 (the DRAM clock or FBD frame clock). The A slots of frames 1-6 include commands RAS 1, CAS 1, RAS 2, RAS 3, CAS 3, and RAS 4, which occur in cycles of clock 2 referred to cycles 1, 2, 3, 5, 6, and 7. Because of the frequency of clock 2 is 4/3 times greater than that of clock 1, during cycle 4 of clock 2, signals scheduled by scheduler 116 for frame 4 are not provided until cycle 5 of clock 2. Cycles 4 and 8 are referred to as bubbles (BBL). Note that there is not a similar bubble in FIG. 5. The A slots of frames 4, 5, and 6 in cycles 5, 6, and 7 include RAS 3, CAS 3, and RAS 4 commands. The B slot of frames 3 and 6 (cycles 3 and 7) hold CAS 2 and CAS 4 signals, while slots B and C other wise hold NOP or WD signals.

The contents in B and C slots get delivered in the next DRAM cycle after delivering the command in A slot. Accordingly, the contents in of the B and C slots and the next frame's A slots gets delivered in same cycle to the DRAM. For example, the CAS 2 in frame 3 is provided by buffer 134 to DRAMs 138-1-138-8 and buffer 154 in cycle 4, which is the cycle after RAS 2 is provided to DRAMs 138-1-138-8 and buffer 154. Likewise, the CAS 4 in frame 6 is provided by buffer 134 to DRAMs 138-1-138-8 and buffer 154 in cycle 8. This generally allows more commands to be provided per unit time than in prior art FIG. 3.

The DRAMs may be DDR 2 DRAMs on some other type of DRAMs, or memory that does not require refresh. The signaling between memory buffer 34 and DRAMs 138-1 . . . 138-8 may be like traditional double data rate 2 (DDR2) signaling. There may be more or less than eight DRAM chips in the modules. Memory devices may be on only one side or both sides of the substrate. Multiple modules may be in series and/or parallel. A system may include one or more than one memory channel.

Figure 7:
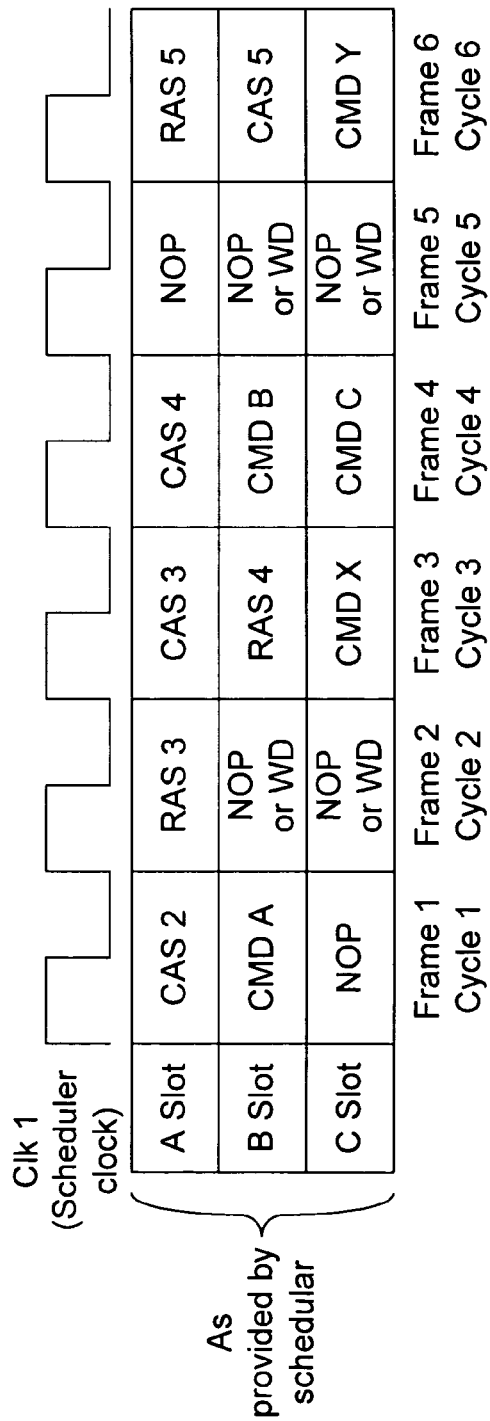
FIG. 7 is a graphical representation of frames as provided by the scheduler of a memory controller according to some embodiments of the inventions.
Figure 8:
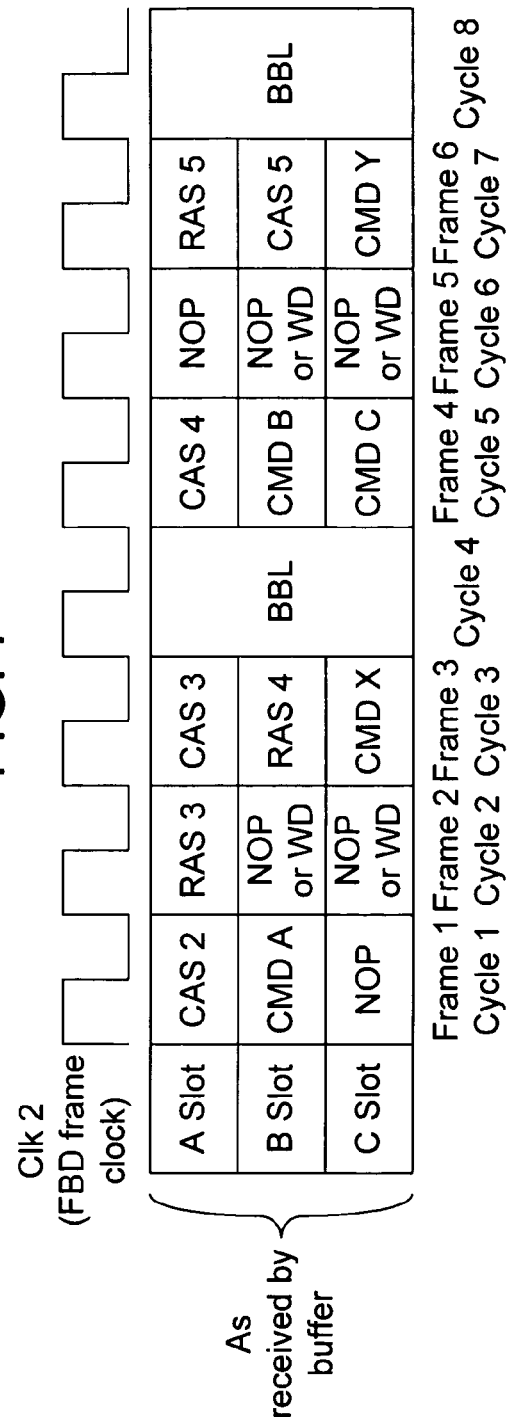
FIG. 8 is a graphical representation of frames as received by a buffer according to some embodiments of the inventions.

FIGS. 7 and 8 illustrate some additional possibilities that may be used in some embodiments, but which are not used in other embodiments. Some memory controllers, buffers, and DRAMs may work with the commands of FIGS. 5 and 6, but not necessarily be capable of working with some commands of FIGS. 7 and 8. Other memory controllers, buffers, and DRAMs can work with either set of commands. The problem is as follows. During a bubble, the command conductors between buffer 134 and DRAMs 138-1-138-8 are not being used by slot A so there is no problem in using them for a command from slot B. But in non-bubble cycles, if a command is taken from slot B and put in the command conductors, it may have contention with the command from slot A. One solution is to provide some commands to one module and other commands to the other module. Another solution is to have a buffer that can provide more than one command at a time and DRAMs that can accept more than one command either in parallel or very rapidly in series.

In FIG. 7, the A slot of frames 1-6 holds CAS 2, RAS 3, CAS 3, CAS4, NOP, and RAS 5 signals. Note that frame 1 is not the first frame provided by the controller. An earlier frame could have included a RAS 1 command signal. The B slot of frames 1-6 holds a command A (CMD A) signal, NOP or WD, RAS 4, CMD B, NOP or WD, and CAS 5 signals. The slot C of frames 1-6 holds NOP, NOP or WD, CMD X, CMD C, NOP or WD, and CMD Y signals. Depending on the protocol used in the particular embodiments, the CMD A, CMD B, CMD X, and CMD Y command signals may be any of a wide variety of commands, such as a refresh command to name one.

In FIG. 8, which shows the frames received by the buffer, there is a bubble in cycles 4 and cycle 8. Accordingly, the scheduler scheduled RAS 4 and RAS 6 commands in the B slot of frames 3 and 6 so that they would be provided by the buffer to DRAMs and remote buffer in the bubble cycles after CAS 3 and CAS 5 signals are provided to DRAMs and remote buffer. Similarly, the other contents of the B and C slots are provided by the buffer to the DRAMs and remote buffer in the next cycle. As noted, some embodiments cannot handle the situation of frames 1 and 4. Other embodiments pass the contents of the B slot in frame 1 to a remote module. If there are three modules, the C slot can be provided to the last of the modules. In the case of frames 3 and 6, in some embodiments, the contents of the B slot could be passed to the DRAMs of the first module and the contents of the C slot could be passed to a remote module. Different embodiments can have different variations of these.

Figure 9:
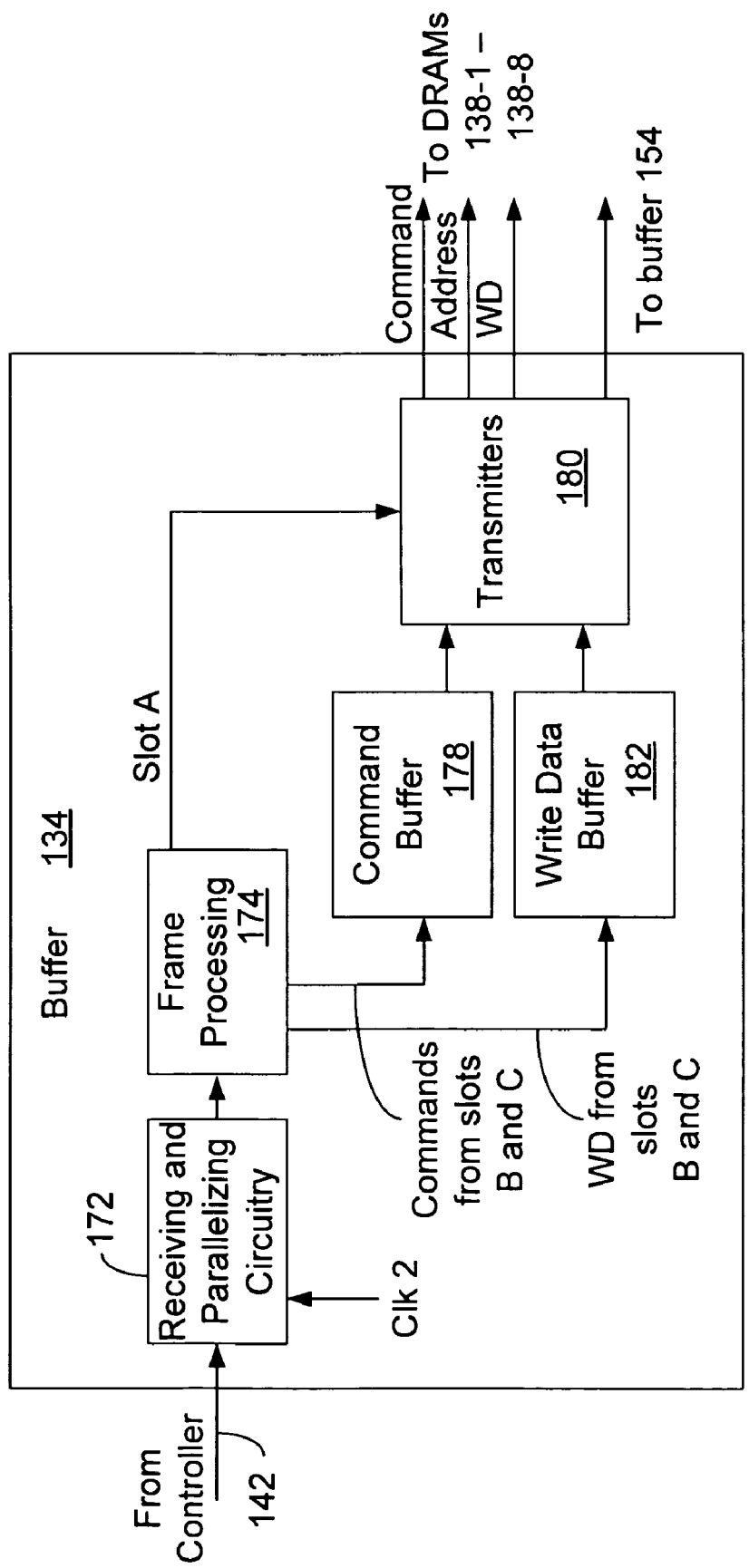
FIG. 9 is a block diagram representation of details of a buffer of FIG. 4 according to some embodiments of the inventions.

There are various ways in which buffer 134 may be implemented. FIG. 9 illustrates an implementation that is used in some embodiments, but not in others. Referring to FIG. 9, buffer 134 includes receiving and parallelizing circuitry 172 that receives the frames from controller 112 through conductors 142. As noted, the signals on conductors 142 are at a higher frequency and on fewer lanes than in buffer 134. Receiving and parallelizing circuitry 172 transitions the frames to a lower frequency on more lanes. Frame processing circuitry 174 removes the A slot from the current frame and provides it to transmitters 180. Frame processing circuitry 174 also removes commands from the B and C slots of the current frame and provides them to a command buffer 178, which from holds them for one cycle before providing to transmitters 180. Buffer 178 provides the B and C slots to transmitters 180 concurrently with frame processing circuitry 174 providing the A slot to transmitters 180. Accordingly, transmitters 180 transmit an A slot of a particular cycle while concurrently transmitting the B and C slots of the previous cycle. When it is said that transmitters 180 transmit the A, B, and C slots concurrently, it is not necessarily simultaneously, but rather can be simultaneously or sequentially in close temporal proximity. Frame processing circuitry 174 also provides write data from the B and C slots of the current frame to write data buffer 182, which holds the write data for one or more cycles until control circuitry decides to release it to the transmitters.

Transmitters 180 provide signals to DRAMs 138-1-138-8 and to buffer 154. In the case of some types of DRAMs, there are separate conductors for command, address, and data signals, but this is not the case in some embodiments. In the case in which separate command, address, and data conductors are used, frame processing circuitry 174 and buffer 178 provide different types of signals to different types of conductors—for example, commands to the command conductors, addresses to the address conductors, and write data to the data conductors. In this case, write data goes to different conductors than a command. There is not contention on the command conductors during the bubbles, because commands from the A slot is not provided during the bubble. NOPs may be treated as commands or otherwise. There may be some mixtures of conductors and signal types; for example, an address conductor used for a command signal. The signals transmitted to buffer 154 may be of the same format as on conductors 142 or in another format.

In some embodiments, there are only two slots and in others there are four or more slots. In some embodiments, the slots are the same size and in other embodiments, they have different sizes. In different embodiments, the use of slots A, B, and C may be different than mentioned above. For example, slot C could carry what is described above for slot A.

In some implementations, there may be a slight write data bandwidth loss cause of the increased number of commands provided by utilizing the B slot to provide commands during bubbles. However, since writes typically take well less than half (for example, 33%) of the total traffic in a computer system (such as a multi-processor system), this is manageable. In some embodiments, the C-slot may be used for only write commands in a fully loaded condition, so that write commands will not disturb the read bandwidth, but this is not the case in other embodiments.

Figure 11:
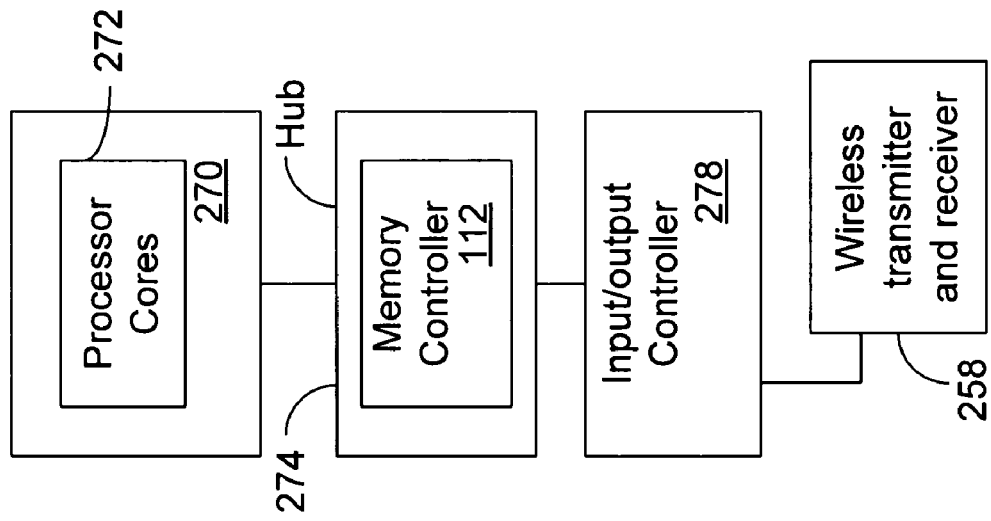
FIG. 11 is a block diagram representation of a system including a chip with processor cores, a chip with a memory controller, an input/output controller chip, and wireless transmitter and receiver circuitry according to some embodiments of the inventions.
Figure 10:
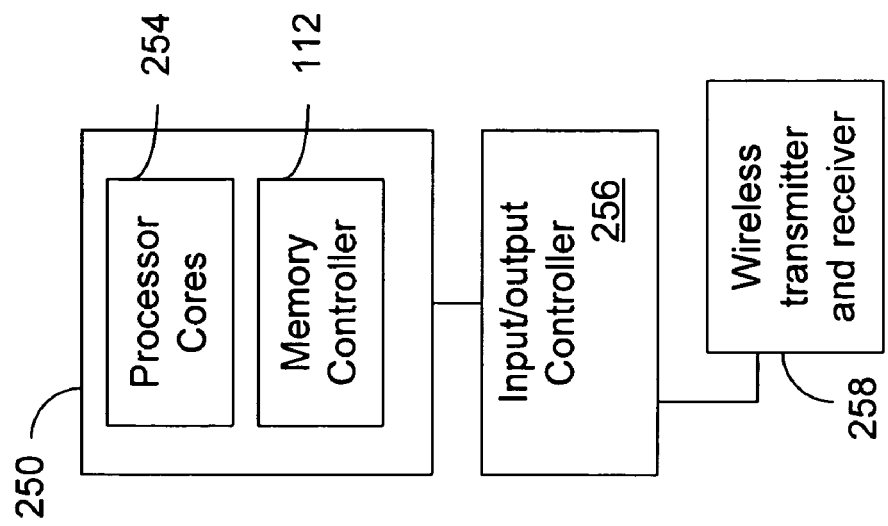
FIG. 10 is a block diagram representation of a system including a chip with processor cores and a memory controller, an input/output controller chip, and wireless transmitter and receiver circuitry according to some embodiments of the inventions.

FIGS. 10 and 11 illustrate that memory controller 112 can be in different chips. For example, in FIG. 10, memory controller 112 is part of a processor chip 250 that includes processor cores 254. Processor chip 250 is coupled to an input/output controller 256 which is coupled to wireless transmitter and receiver circuitry 258. In FIG. 11, memory controller 112 is part of a hub chip 274 which is coupled between a processor chip 270 that includes processor cores 272 and an input/output controller 278. Input/output controller 278 is coupled to wireless transmitter and receiver circuitry 258.

Other Information and Embodiments

The time units referred to above are clock cycles, but they could be half clock cycles in the case of DDR.

The inventions may be used in systems that do not involved FBDIMM systems.

In some implementations, there may be reasons to not put a command in every B slot prior to a bubble, The conductors mentioned herein do not have to be of continuous material. For example, they may include vias or other connection structures.

The memory chips may be all part of the same rank or may be part of different ranks. There could be memory modules in series.

The inventions are not restricted to any particular signaling techniques or protocols. For example, the signaling may be single ended or differential. The signaling may include only two voltage levels or more than two voltage levels. The signaling may be single data rate, double data rate, quad data rate, or octal data, etc. The signaling may involve encoded symbols and/or packetized signals. A clock (or strobe) signal may be transmitted separately from the other signals or embedded in the other signals. Various coding techniques may be used. Strobe signals could be used rather than clock signals. In some embodiments, in the interconnects between chips, the command, address, and write data signals are not all on the same conductor lanes.

There may be intermediate structure between the memory controller chip, memory chips, and connector and the motherboard. The various chips described or illustrated herein may have additional inputs or outputs which are not illustrated or described. In actual implementations of the systems of the figures, there would be additional circuitry, control lines, and perhaps interconnects which are not illustrated. When the figures show two blocks connected through conductors, there may be intermediate circuitry that is not illustrated. The shape and relative sizes of the blocks is not intended to relate to actual shapes and relative sizes.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments.

When it is said the element "A" is coupled to element "B," element A may be directly coupled to element B or be indirectly coupled through, for example, element C.

When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B."

If the specification states a component, feature, structure, process, or characteristic "may", "might", or "could" be included, that particular component, feature, structure, process, or characteristic is not required to be included. If the specification or claim refers to "a" or an element, that does not mean there is only one of the element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A chip comprising:
chip interface transmitters to transmit signals in frames including slots;
a scheduler to schedule frames having at least a first slot, a second slot and a third slot at a first frequency including commands for first slots of the frames and write data in the second and third slots in general and commands for the first and second slots and write data in the third slots of frames immediately preceding bubbles caused by frequency mismatch when the frames are scheduled at a second frequency;
clock gearing logic to provide a first clock signal having the first frequency to a scheduler of a memory controller and to provide a second clock signal having the second frequency to memory devices.

2. The chip of claim 1, wherein the clock gearing logic detects locations of the bubbles and notifies the scheduler of the locations through a beat signal.

3. The chip of claim 1, wherein a first clock signal having the first frequency is provided to the scheduler and the clock gearing logic, and a second clock signal having the second frequency is provided to the clock gearing logic and the transmitters.

4. The chip of claim 1, wherein the scheduler also schedules write data and no operation signals to the second slots of some of the frames.

5. The chip of claim 1, wherein the scheduler also schedules no operation signals to the first slots of some of the frames.

6. The chip of claim 1, wherein the scheduler schedules commands to third slots of some of the frames.

7. The chip of claim 1, wherein the first slot is an A slot and the second slot is a B slot of a Fully-Buffered DIMM frame.

8. A chip including:
  transmitters;
  buffers;
  a scheduler to schedule frames having at least a first slot, a second slot and a third slot at a first frequency including commands for first slots of the frames and write data in the second and third slots in general and commands for the first and second slots and write data in the third slots of frames immediately preceding bubbles caused by frequency mismatch when the frames are scheduled at a second frequency;
  frame processing circuitry to provide signals from first slots of frames to the transmitters, and signals from second slots of the frames to the buffers, wherein in response to a next clock unit, signals from the second slots held in the buffers are provided to a transmitters with signals from the first slot of a next frame;
  clock gearing logic to provide a first clock signal having the first frequency to a scheduler of a memory controller and to provide a second clock signal having the second frequency to memory devices.

9. The chip of claim 8, wherein the transmitters include different groups of transmitters to provide signals being transmitted to different external conductors, and wherein the frame processing circuitry and the buffers provide the signals to different group of the transmitters depending on the type of signal.

10. The chip of claim 8, wherein the clock unit is a clock cycle.

11. The chip of claim 8, wherein the frame processing circuitry provides signals from third slots of the frames to the buffers, wherein in response to the next clock unit, signals from the third slots held in the buffers are provided to a transmitters with signals from the first slot of the next frame.

12. A system comprising:
  a memory controller to provide frames of signals including at least first, second and third slots, the memory controller comprising
    a plurality of transmitters,
    a plurality of buffers,
    a scheduler to schedule frames having at least a first slot, a second slot and a third slot at a first frequency including commands for first slots of the frames and write data in the second and third slots in general and commands for the first and second slots and write data in the third slots of frames immediately preceding bubbles caused by frequency mismatch when the frames are scheduled at a second frequency,
    frame processing circuitry to provide signals from first slots of frames to the transmitters, and signals from second slots of the frames to the buffers, wherein in response to a next clock unit, signals from the second slots held in the buffers are provided to a transmitters with signals from the first slot of a next frame,
    clock gearing logic to provide a first clock signal having the first frequency to a scheduler of a memory controller and to provide a second clock signal having the second frequency to memory devices; and
  a first memory module having a first group of memory chips and a first buffer to receive the frames and provide the signals of the first slots with the signals of the second slots from a previous clock unit, and wherein for some of the frames, the second slots include commands that are provided by the buffer to first memory chips during frequency mismatch bubbles.

13. The system of claim 12, further comprising a second memory module including a second group of memory chips and a second buffer to receive signals from the first buffer and to provide at least some of the signals of the first slots with at least some of the signals of the second slots from a previous clock unit, and wherein for some of the frames, the second slots include commands that are provided by the second buffer to the second group of memory chips during frequency mismatch bubbles.

14. The system of claim 12, wherein the frames include third slots.

15. The system of claim 12, wherein the memory controller includes:
  chip interface transmitters to transmit signals in the frames;
  a scheduler to schedule signals at a first frequency including commands for the first slots in general and commands for the second slots of at least some frames immediately preceding the frequency mismatch bubbles occurring when the frames are at a second frequency;
  clock gearing logic to provide the signals having the first frequency from the scheduler to the transmitters at the second frequency.

16. The system of claim 12, wherein the clock gearing logic detects locations of the bubbles and notifies the scheduler of the locations through a beat signal.

17. The system of claim 12, wherein the first buffer includes transmitters, internal buffers, and frame processing circuitry to provide signals from the first slots to the transmitters, and signals from the second slots to the internal buffers, wherein in response to a next clock unit, signals from the second slots held in the internal buffers are provided to a transmitters with signals from the first slot of a next frame.

18. The system of claim 17, wherein the transmitters include different groups of transmitters to provide signals being transmitted to different external conductors, and wherein the frame processing circuitry and the buffers provide the signals to different group of the transmitters depending on the type of signal.

19. The system of claim 17, wherein the frame processing circuitry provides signals from third slots of the frames to the buffers, wherein in response to the next clock unit, signals from the third slots held in the buffers are provided to a transmitters with signals from the first slot of the next frame.

20. The system of claim 12, wherein the clock unit is a clock cycle.

21. The system of claim 12, further comprising a processor chip including processor cores, wherein the memory controller is part of the processor chip.

22. The system of claim 12, further comprising wireless transmitter and receiver circuitry coupled to a chip that includes the memory controller.

* * * * *